(12) United States Patent
Park

(10) Patent No.: US 6,943,403 B2
(45) Date of Patent: Sep. 13, 2005

(54) NON-VOLATILE MEMORY CELLS HAVING FLOATING GATE AND METHOD OF FORMING THE SAME

(75) Inventor: Sung-Chul Park, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/669,795

(22) Filed: Sep. 23, 2003

(65) Prior Publication Data

US 2004/0119110 A1 Jun. 24, 2004

(30) Foreign Application Priority Data

Dec. 20, 2002 (KR) .................................. 10-2002-0081790

(51) Int. Cl.[7] .......................................... H01L 29/788
(52) U.S. Cl. ........................ 257/317; 257/315; 257/316
(58) Field of Search ............................... 257/314, 315, 257/316, 317

(56) References Cited

U.S. PATENT DOCUMENTS 6,469,341 B1 * 10/2002 Sung et al. ................. 257/316
6,670,239 B2 * 12/2003 Yoon ........................... 438/257
6,727,545 B2 * 4/2004 Wang et al. ................. 257/321

FOREIGN PATENT DOCUMENTS

JP 3-34577 2/1991
KR 1997-18737 4/1997

OTHER PUBLICATIONS

English Abstract Only***.

* cited by examiner

Primary Examiner—David Nelms
Assistant Examiner—Quoc Hoang
(74) Attorney, Agent, or Firm—F. Chau & Associates, LLC

(57) ABSTRACT

A non-volatile memory cell having a floating gate and a method of forming the same. The non-volatile memory cell includes a device isolation layer that is formed in a semiconductor substrate and defines an active region. A floating gate is disposed over the active region and is comprised of a plurality of first conductive patterns and a plurality of second conductive patterns that are alternately stacked. A first insulation layer is disposed between the floating gate and the active region. One of the first conductive pattern and the second conductive pattern protrudes to form concave and convex sidewalls of the floating gate. Therefore, a surface area of the floating gate increases, thereby raising coupling ratio between the floating gate and the control gate electrode. As a result, an operating voltage of the non-volatile memory cell can be reduced.

11 Claims, 18 Drawing Sheets

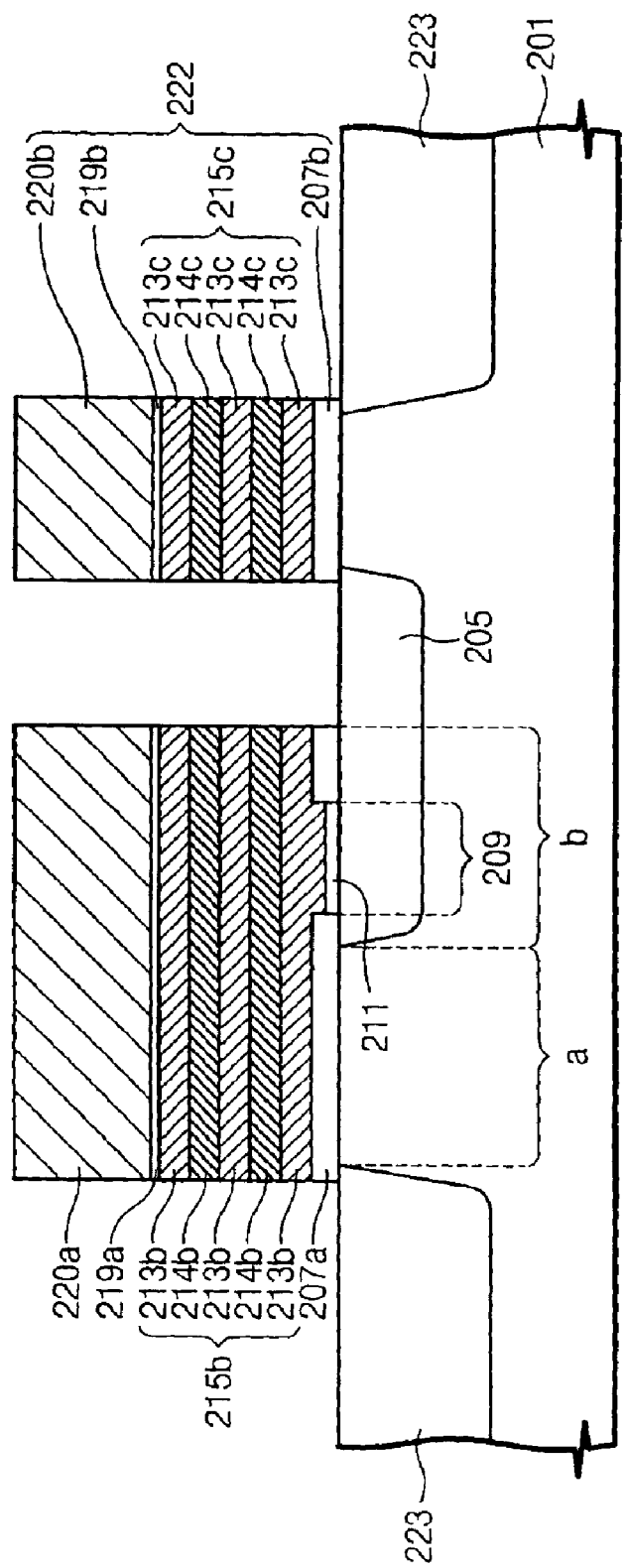

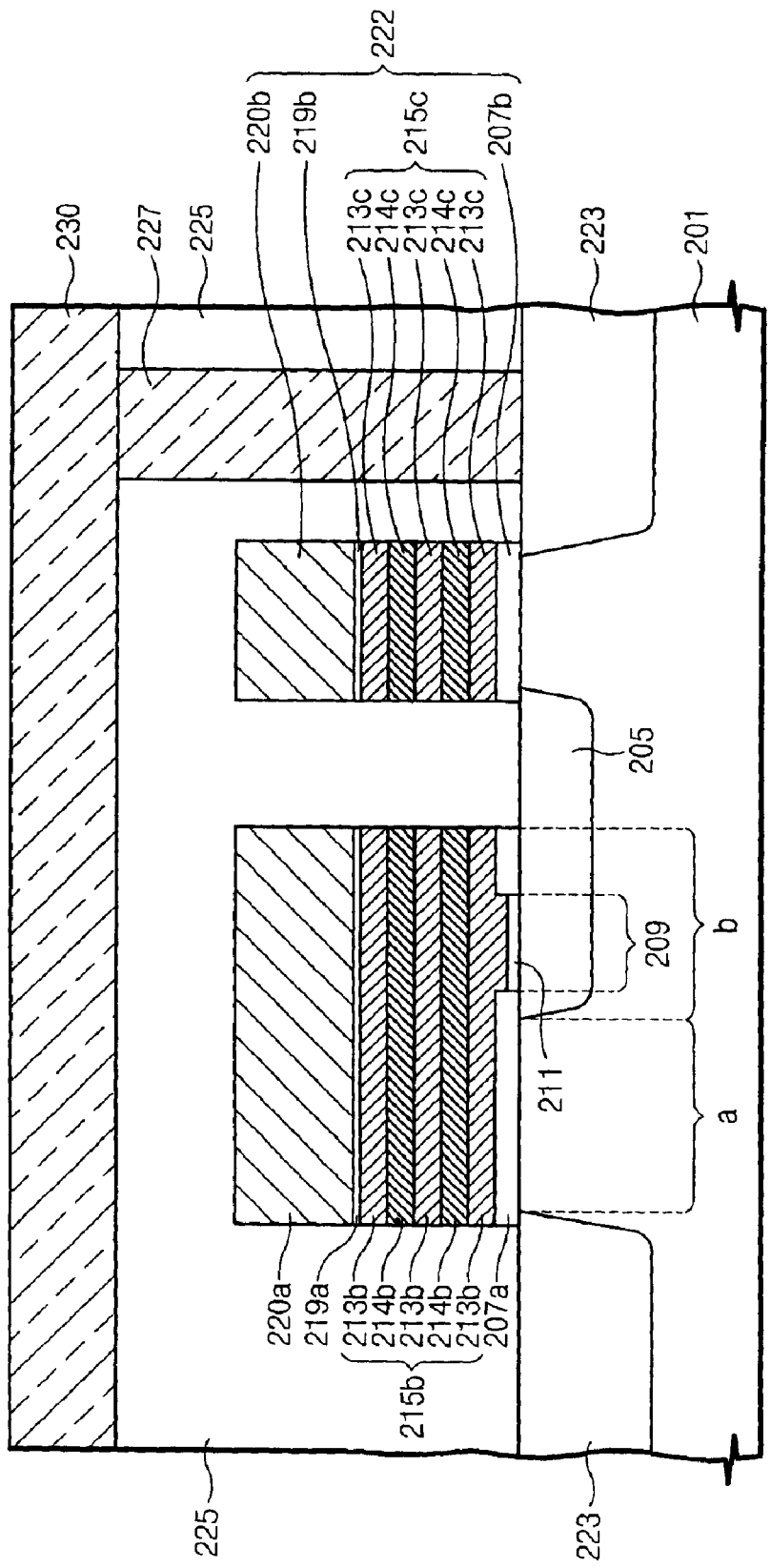

NON-VOLATILE MEMORY CELLS HAVING FLOATING GATE AND METHOD OF FORMING THE SAME

FIELD OF THE INVENTION

The present invention generally relates to a semiconductor device and a method of forming the same and more specifically to a non-volatile memory cell with a floating gate and a method of forming the same.

BACKGROUND OF THE INVENTION

A non-volatile memory device with a floating gate is capable of electrically programming and erasing data. In addition, a non-volatile memory device does not lose programmed data when power is cut off. A non-volatile memory device with a floating gate performs programming or erasing operations by injecting electrons into an electrically insulated floating gate or ejecting electrons from the floating gate. Electrons penetrate an insulation layer interposed between the floating gate and a semiconductor substrate either by hot carrier injection or Fowler-Nordheim tunneling (FN tunneling). Generally, a non-volatile memory device with a floating gate injects electrons into the floating gate or ejects electrons from the floating gate depending on a voltage of the floating gate driven by an operation voltage (i.e., a program voltage or an erasing voltage) that is applied to a control gate electrode located over the floating gate.

As semiconductor devices become highly integrated, a low operating voltage and a short line width is required. Thus, coupling ratio between the floating gate and the control gate electrode becomes an important factor in raising capacitance, which in turn reduces the operation voltage of the memory device. Coupling ratio means a ratio of the operation voltage of the control gate electrode to the voltage of the floating gate. If the coupling ratio increases, the voltage driven to the floating gate also increases with respect to the operation voltage of the control gate electrode. Therefore, the operation voltage of the non-volatile memory device with the floating gate can be decreased. Meanwhile, the coupling ratio increases as the capacitance between the floating gate and the control gate increases. Recently, various methods have been provided to raise the capacitance between the floating gate and the control gate electrode.

SUMMARY OF THE INVENTION

It is one aspect of the present invention to provide non-volatile memory cells with a floating gate that can increase coupling ratio in order to reduce operation voltage.

It is another aspect of the present invention to provide a method of forming a non-volatile memory cell with a floating gate that can increase coupling ratio in order to reduce operation voltage.

One exemplary embodiment of the non-volatile memory cell of the invention includes a device isolation layer disposed in a semiconductor substrate. The device isolation layer defines an active region. A floating gate is disposed over the active region and comprises a plurality of first conductive patterns and second conductive patterns that are alternately stacked. A first insulation layer is interposed between the floating gate and the active region. One of the first and second conductive patterns protrudes to form concave and convex shaped sidewalls of the floating gate.

In embodiments of the present invention, one of the first and second conductive patterns may be formed of a doped polysilicon layer and the other may be formed of a doped silicon germanium layer. The doped polysilicon layer protrudes to form convex portions of the sidewalls of the floating gate, and the doped silicon germanium layer forms concave portions of the sidewalls of the floating gate.

In an exemplary embodiment, the non-volatile memory cell further comprises a control gate electrode that is disposed over the floating gate electrode and crosses over the active region, and a gate interlayer dielectric pattern disposed between the control gate electrode and the floating gate. The gate interlayer dielectric pattern and the control gate electrode are disposed on a top surface and the concave and convex sidewalls of the floating gate.

The nonvolatile memory cell may further comprise a selection gate pattern crossing over the active region at one side of the control gate electrode, and a floating impurity diffusion layer disposed in the active region between the selection gate pattern and the control gate electrode. In an exemplary embodiment, a portion of the floating impurity diffusion layer may overlap a portion of the floating gate. A tunnel window region may be disposed in the overlapping region, wherein the tunnel window region includes a predetermined bottom region of the floating gate and the active region thereunder. A second insulation layer may be disposed between the floating gate and the active region in the tunnel window region. The second insulation layer may be thinner than the first insulation layer.

According to one exemplary embodiment of the method of forming a non-volatile memory cell of the invention, a device isolation layer is formed to define an active region. A first insulation layer is formed on the active region. A gate conductive layer is formed on an entire surface of a semiconductor substrate with the first insulation layer. The gate conductive layer comprises a plurality of first conductive layers and second conductive layers that are alternately stacked. A floating gate with concave and convex sidewalls is formed by applying a patterning process including an isotropic etching of the gate conductive layer. In this case, the isotropic etching has etch selectivity with respect to the first and second conductive layers.

In embodiments of the present invention, one of the first and second conductive layers may be formed of a doped polysilicon layer, and the other may be formed of a doped silicon germanium layer. In an exemplary embodiment, the isotropic etching is performed by dry etching using etch gas that includes $HeO_2$. The etch gas etches the doped silicon germanium layer faster than the doped polysilicon layer. The doped polysilicon layer and the doped silicon germanium layer may be doped using an in-situ method.

The method explained above may further comprise a step of forming a gate interlayer dielectric pattern and a control gate electrode that are disposed on the floating gate. The gate interlayer dielectric pattern and the control gate electrode are formed on a top surface and the concave and convex sidewalls of the floating gate.

The step of forming the floating gate, the gate interlayer dielectric pattern, and the control gate electrode may include forming a preliminary gate conductive pattern by patterning the gate conductive layer using an anisotropic etching. A gate conductive pattern having concave and convex sidewalls is formed by an etching of the sidewalls of the preliminary gate conductive pattern using an isotropic etching process. A gate interlayer dielectric layer and a control gate conductive layer are sequentially formed on an entire surface of the semiconductor substrate with the gate conductive pattern. The control gate conductive layer, the gate interlayer dielectric layer and the gate conductive pattern are successively patterned to form a floating gate, a gate interlayer dielectric pattern and a control gate electrode that are sequentially stacked. The control gate electrode crosses over the active region.

Exemplary embodiments of the method according to the invention may include a step of forming a selection gate pattern that crosses over the active region at one side of the control gate electrode. The steps of forming the floating gate, the gate interlayer dielectric pattern, the control gate electrode, and the selection gate pattern may include a step of forming a preliminary gate conductive pattern by an anisotropic etching of the gate conductive layer. A gate conductive pattern having concave and convex sidewalls is formed by an isotropic etching of sidewalls of the preliminary gate conductive pattern. A control gate dielectric layer and a control gate conductive layer are sequentially formed on an entire surface of the substrate with the gate conductive pattern. The control gate conductive layer, the gate interlayer dielectric layer and the gate conductive pattern are successively patterned to form a floating gate, a gate interlayer dielectric and a control gate electrode that are sequentially stacked, and at the same to form a selection gate pattern crossing over the active region at one side of the control gate electrode.

BRIEF DESCRIPTION OF THE DRAWINGS

The above and other features and advantages of the present invention will become more apparent by describing in detail preferred embodiments thereof with reference to the attached drawings in which:

FIG. 10 is a cross-sectional view taken along a line III–III' of FIG. 8;

FIGS. 11A through 15A are top plane views showing a non-volatile memory cell in accordance with another exemplary embodiment of the present invention;

FIGS. 11B through 15B are cross-sectional views taken along a line IV–IV' of FIGS. 11A through 15A; and FIGS. 11C through 15C are cross-sectional views taken along a line V–V' of FIGS. 11A through 15A;

DETAILED DESCRIPTION OF THE PREFERRED EMBODIMENT

Figure 1:
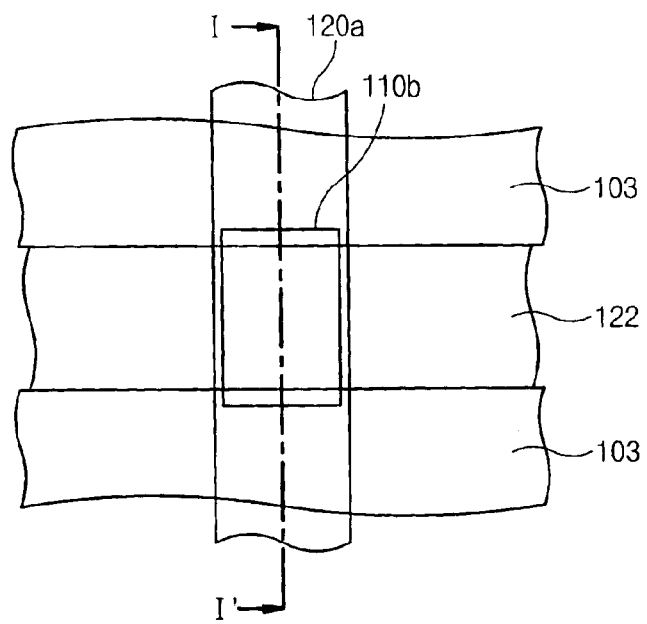
FIG. 1 is a cross-sectional view of a non-volatile memory cell in accordance with one exemplary embodiment of the present invention.

The present invention will be described more fully hereinafter with reference to the accompanying drawings, in which exemplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
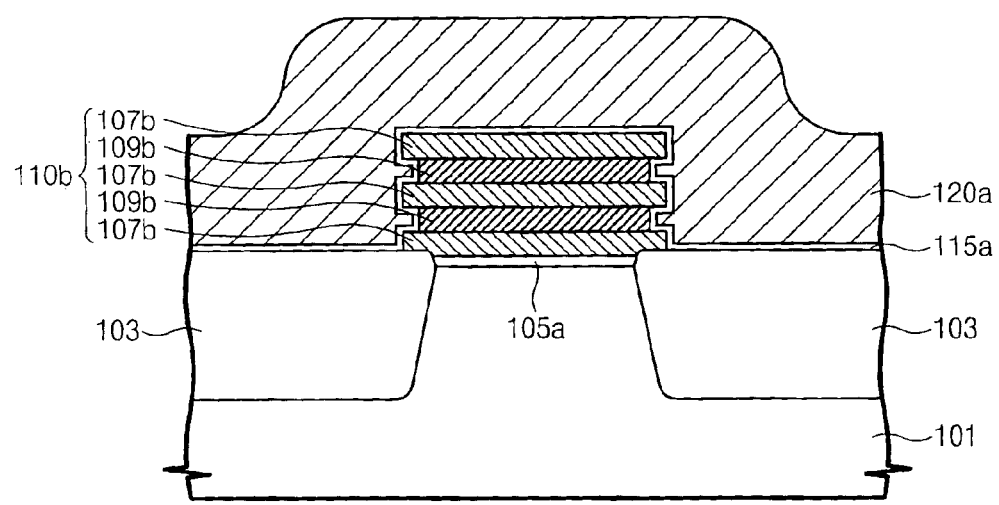
FIG. 2 is a cross-sectional view taken along a line I–I' of FIG. 1.

FIG. 1 is a cross-sectional view of a non-volatile memory cell in accordance with one exemplary embodiment of the present invention and FIG. 2 is a cross-sectional view taken along a line I–I' of FIG. 1.

Referring to FIGS. 1 and 2, a device isolation layer 103 defining an active region is disposed in a semiconductor substrate 101. The device isolation layer 103 may be formed of a trench device isolation layer, and may be formed of a silicon oxide layer.

A floating gate 110b having concave and convex sidewalls is disposed on the active region. The floating gate 110b comprises a plurality of first conductive patterns 107b and a plurality of second conductive patterns 109b that are alternately stacked. One of the first conductive pattern 107a and the second conductive pattern 109a protrudes to form convex portion of the sidewalls of the floating gate 110b and the other forms concave portion of the sidewalls of the gate electrodes 110b.

One of the first conductive pattern 107b and the second conductive pattern 109b may be formed of a doped polysilicon layer and the other may be formed of a doped silicon germanium layer. In case that the first conductive pattern 107b is formed of doped polysilicon layer and the second conductive pattern 109b is formed of doped silicon germanium layer, the first conductive pattern 107b protrudes to form convex portion of the sidewalls of the floating gate 110b. Meanwhile, the second conductive pattern 109b is formed of convex portion of the sidewalls of the floating gate 110b.

A tunnel insulation pattern 105a is interposed between the floating gate 110b and the active region. The tunnel insulation pattern 105a may be formed of silicon oxide. A control gate electrode 120a is disposed over the floating gate 110b. The floating gate electrode 120a crosses over the active region. The control gate electrode 120a is also disposed over the concave and convex sidewalls of the floating gate 110b. The control gate electrode 120a may be formed of a conductive layer, for example, a doped polysilicon layer or a polycide layer. The polycide layer comprises a doped polysilicon layer and a metal silicide layer that are stacked. A gate interlayer dielectric pattern 115a is interposed between the control gate electrode 120a and the floating gate 110b. The gate interlayer dielectric pattern 115a is conformally formed along top surface and the concave and convex sidewalls of the floating gate 110b. The control gate electrode 120a fills the concave portion of the sidewalls of the floating gate 110b. The gate interlayer dielectric pattern 115a is formed of a dielectric layer, for example, a silicon oxide layer or an oxide-nitride-oxide (ONO) layer. In addition, the gate interlayer dielectric pattern 115a may be formed of a high-k dielectric layer having dielectric constant higher than that of the ONO layer. Impurity diffusion layers 122 are disposed in the active region at both sides of the control gate electrode 120a. The impurity diffusion layer 122 may correspond to source/drain regions.

In the non-volatile memory cell, the floating gate 110b has an increased surface area due to the concave and convex sidewalls. Therefore, the area where the control gate electrode 120a overlaps the floating gate 110b increases, such that capacitance between the control gate electrode 120a and the floating gate 110b increases. As a result, coupling ratio increases, thereby reducing an operation voltage (a programming voltage or an erasing voltage) of the non-volatile memory cell.

In the non-volatile memory cell, electrons may tunnel through the tunnel insulation pattern 105a under the floating gate 110b by FN tunneling.

The non-volatile memory cell in accordance with the above exemplary embodiment may be employed in a flash memory device, for example, a NAND type flash memory device or a NOR type flash memory device and the like.

Figure 3:
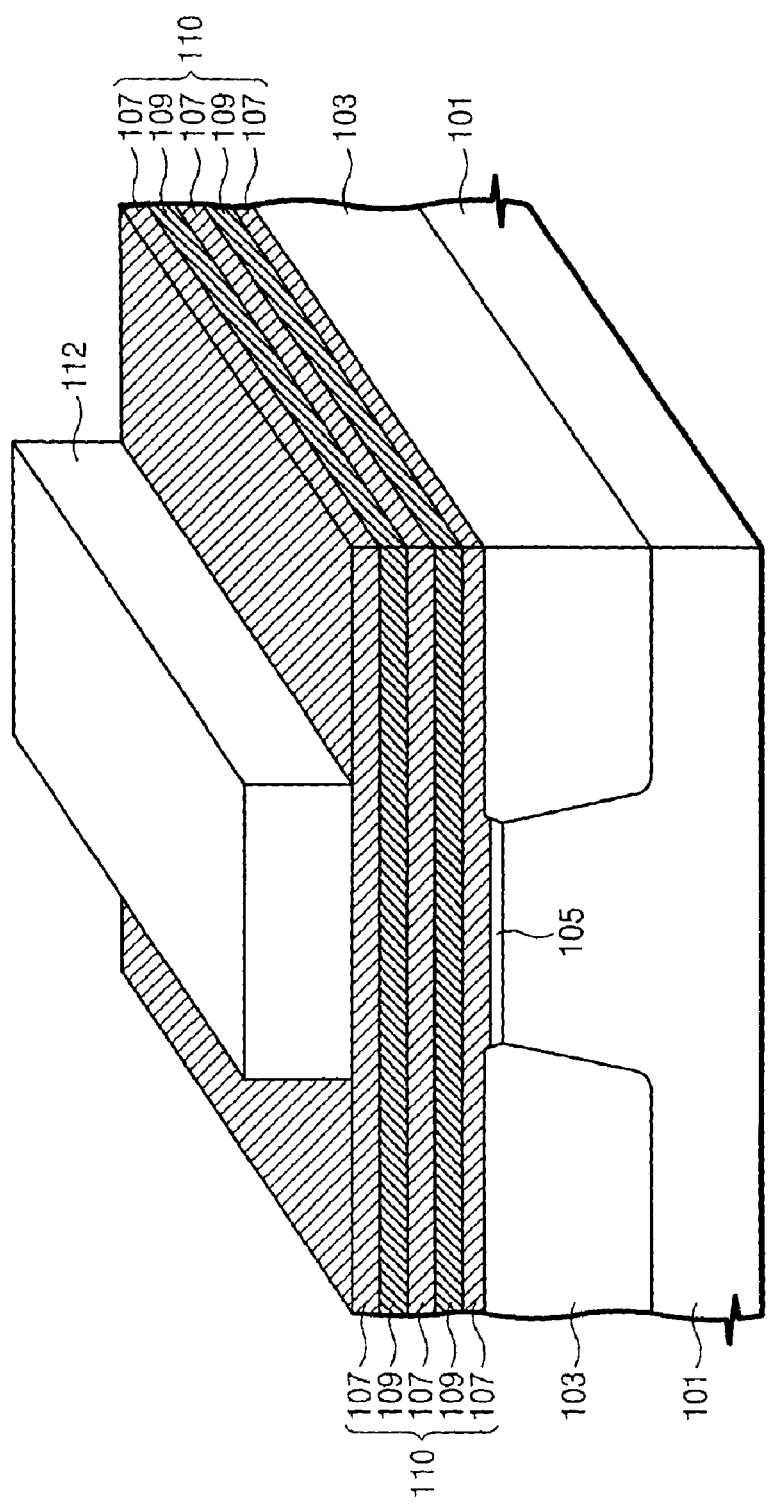
FIGS. 3 through 7 are cross-sectional views showing a non-volatile memory cell in accordance with one exemplary embodiment of the present invention.

FIGS. 3 through 7 are cross-sectional views showing the nonvolatile memory cell in accordance with one exemplary embodiment of the present invention Referring to FIG. 3, a device isolation layer 103 is formed in a predetermined region of the semiconductor substrate 101 to define an active region. The device isolation layer 103 may be formed of a trench device isolation layer. A tunnel insulation layer 105 is formed on a semiconductor substrate with the active region. The tunnel insulation layer 105 may be formed of thermal oxide or CVD silicon oxide.

A gate conductive layer 110 is formed on an entire surface of the semiconductor substrate 101 with the tunnel insulation layer 105. The gate conductive layer 110 is formed by alternately stacking a plurality of first conductive layers 107 and a plurality of second conductive layers 109. One of the first and second conductive layers 107 and 109 may be formed of a doped polysilicon layer and the other may be formed of a doped silicon germanium layer.

The doped polysilicon layer and the doped silicon germanium layer may be doped by an in-situ method. Alternatively, the doped polysilicon layer and the doped silicon germanium layer may be doped by an ion implantation.

A photoresist pattern 112 is formed on the gate conductive layer 110.

Figure 4:
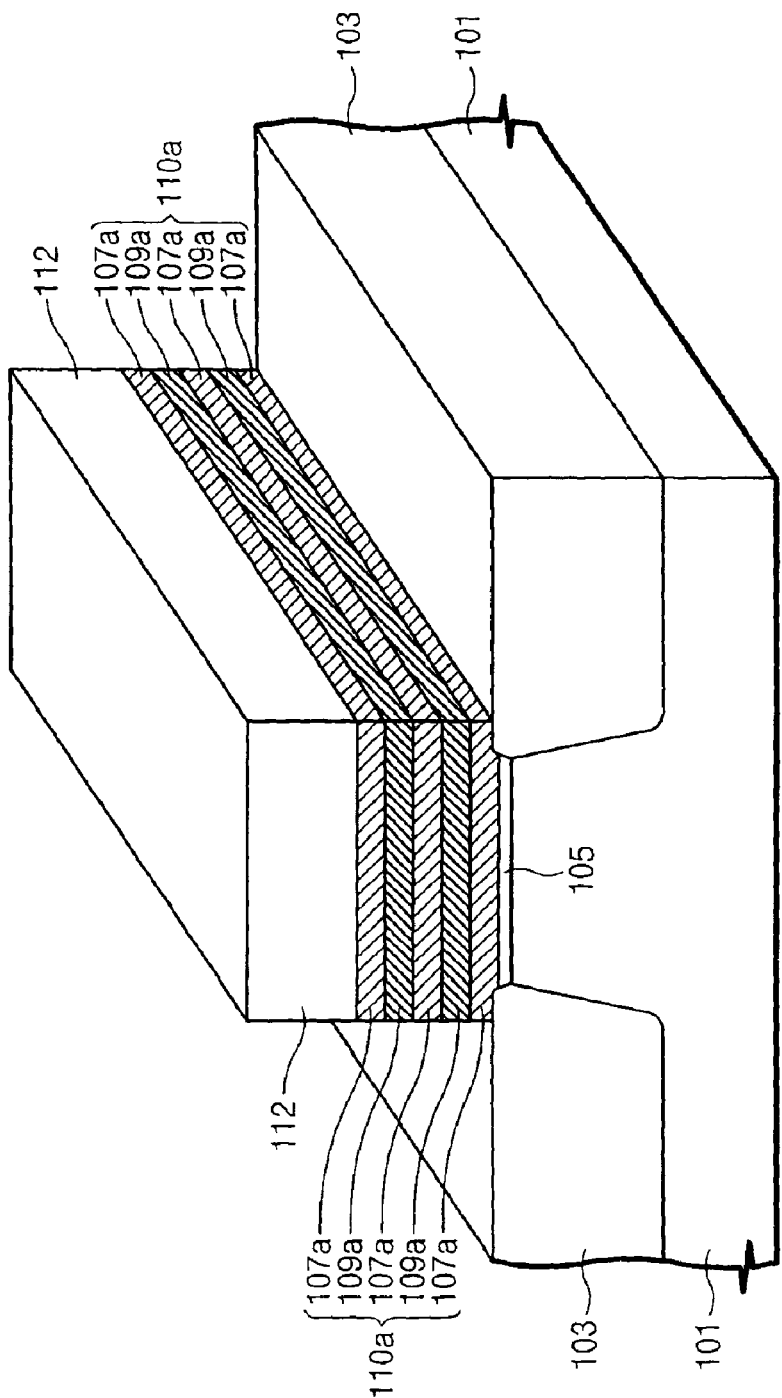
Figure 5:
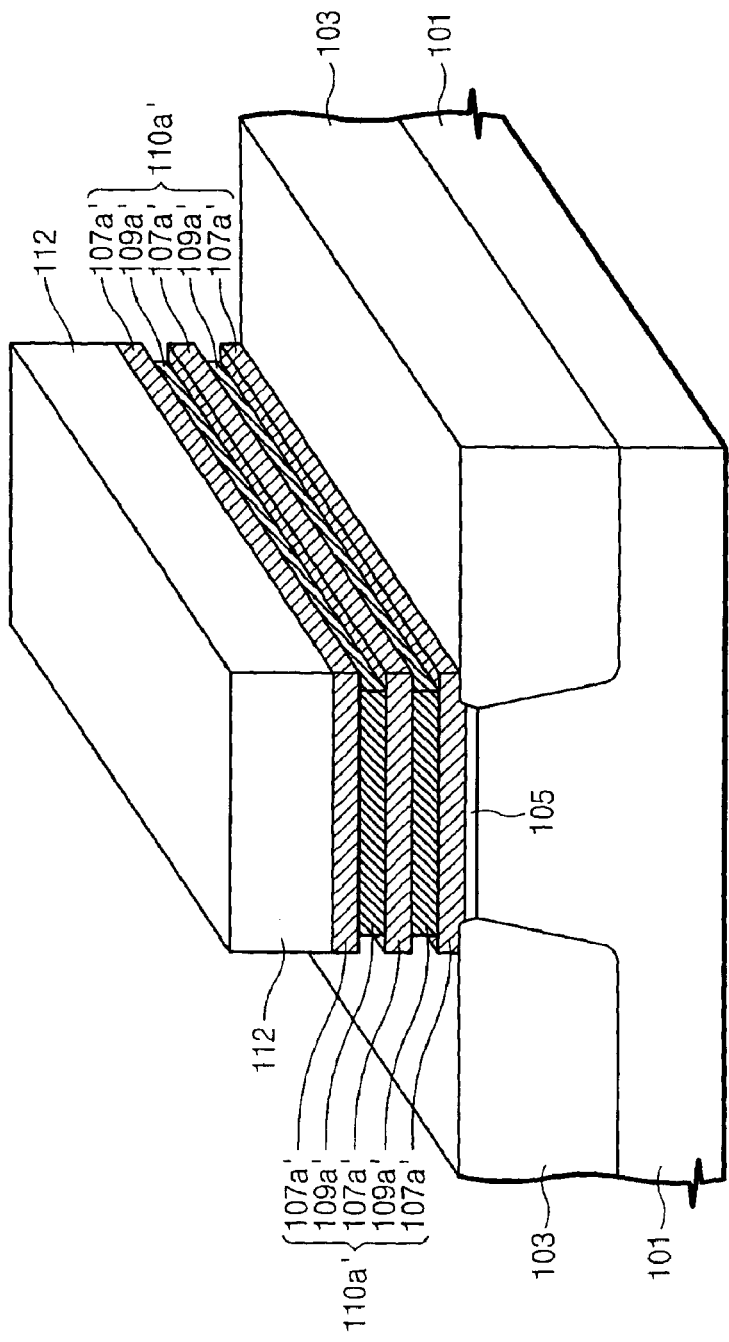

Referring to FIGS. 4 and 5, using the photoresist pattern 112 as a mask, the gate conductive layer 110 is patterned by an anisotropic etching to form a preliminary gate conductive pattern 110a. The sidewalls of the preliminary gate conductive pattern 110a comprise flat sidewalls of the first and second conductive layers 107a and 109a that are anisotropically etched. The preliminary gate conductive pattern 110a may be formed on an entire surface of the active region.

Using again the photoresist pattern 112 as a mask, the preliminary gate conductive pattern 110a is isotropically etched to form a gate conductive pattern 110a' having concave and convex sidewalls. The isotropic etching has etch selectivity with respect to the first and second conductive layers 107a and 109a that are anisotropically etched. The isotropic etching may be performed by dry etching which uses an etch gas including $HeO_2$. The etch gas including $HeO_2$ has etch selectivity with respect to the doped polysilicon layer and the doped silicon germanium layer. Specifically, the etch gas including $HeO_2$ etches the doped silicon germanium layer faster than the doped polysilicon layer. Accordingly, in case that the first and second conductive layers 107 and 109 of FIG. 3 are formed of the doped polysilicon layer and the doped silicon germanium layer, respectively, the second conductive layers 109a' is further etched than the first conductive layers 109a' using the isotropic etching. Thus, concave portions of the sidewalls of the gate conductive pattern 110a' are formed. Meanwhile, the anisotropically etched first conductive patterns 109a' protrude to form convex portions of the sidewalls of the gate conductive pattern 110a'.

Figure 6:
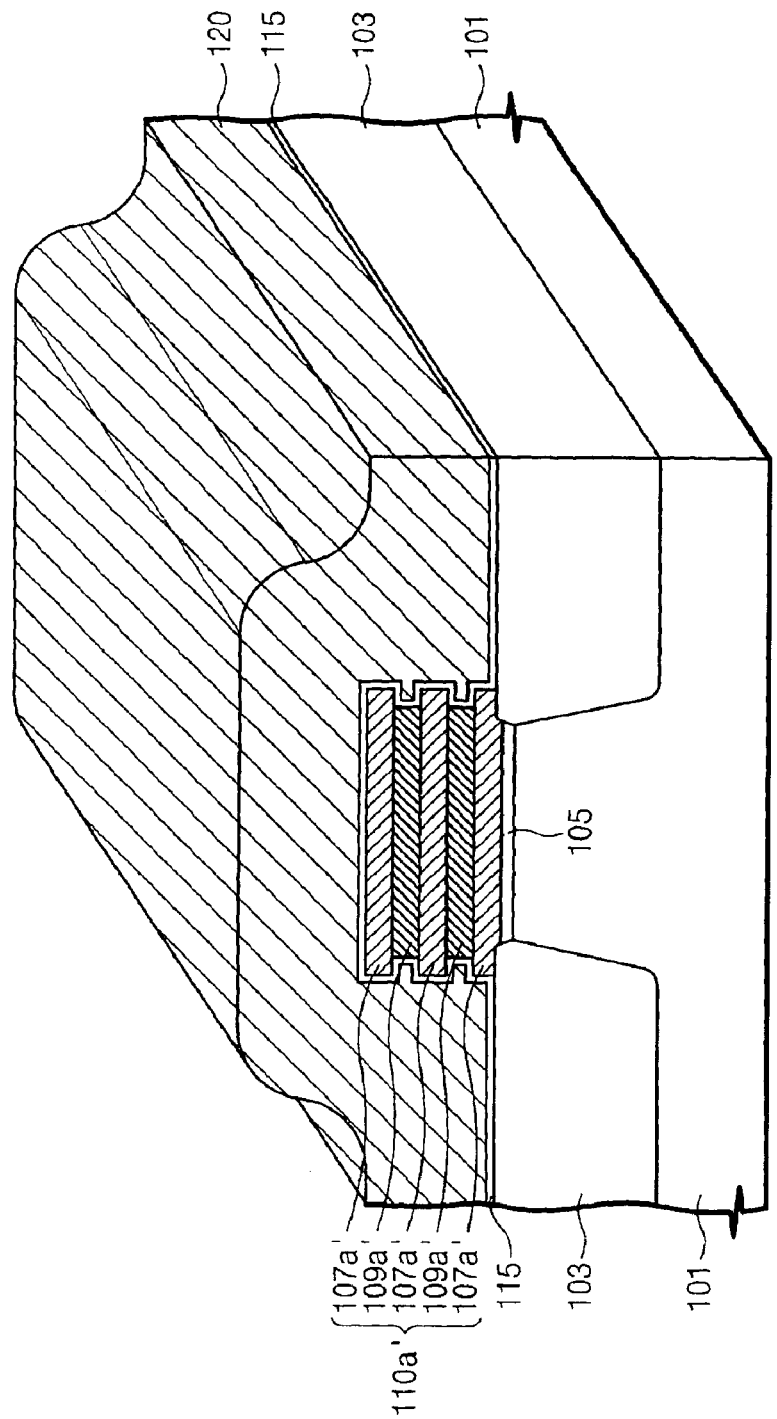
Figure 7:
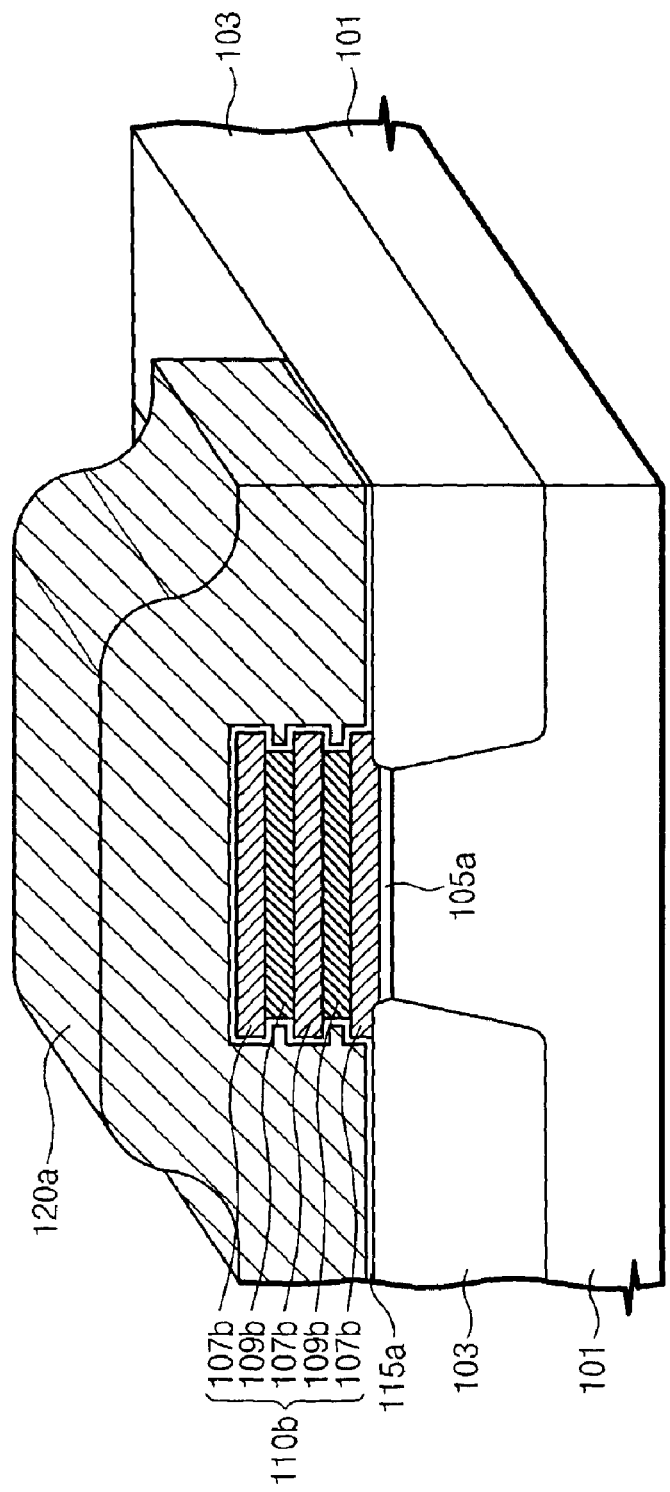

Referring to FIGS. 6 and 7, a photoresist pattern 112 is removed from the semiconductor substrate 101 with the gate conductive pattern 110a' to expose a top surface of the gate conductive pattern 110a'. A conformal gate interlayer dielectric layer 115 is formed on an entire surface of the semiconductor substrate 101 with the exposed top surface of the gate conductive pattern 110a'. The gate interlayer dielectric layer 115 is conformally formed along the concave and convex shapes of the sidewalls of the gate electrode pattern 110a'. The gate interlayer dielectric layer 115 may be formed of a silicon oxide layer or an ONO layer. However, the gate interlayer dielectric layer 115 may be formed of a high-k dielectric layer having a dielectric constant higher than that of the ONO layer.

A control gate conductive layer 120 is formed on the gate interlayer dielectric layer 115. The control gate conductive layer 120 is formed of a conductive layer that is capable of filling the concave portion of the gate conductive pattern 110a', for example, a doped polysilicon layer or a polycide layer. The doped polysilicon layer has good step coverage and sufficiently fills the concave portions of the sidewalls of the gate conductive pattern 110a'.

The control gate conductive layer 120, the gate interlayer dielectric layer 115, the gate conductive pattern 110a', and the tunnel insulation layer 105 are successively patterned to form a tunnel insulation pattern 105a, a floating gate 110b, a gate interlayer dielectric pattern 115a, and a control gate electrode 120a that are sequentially stacked. The floating gate 110b comprises first conductive patterns 107b and second conductive patterns 109b that are alternately stacked. The floating gate 110b is electrically insulated. The control gate electrode 120a crosses over the active region. The control gate electrode 120a is disposed on the concave and convex sidewalls of the floating gate 110b. Thus, capacitance of the floating gate 110b and the control gate electrode 120a increase. As a result, coupling ratio increases to reduce an operation voltage of a non-volatile memory cell with the floating gate 110b.

The tunnel insulation layer 105 of the active region at both sides of the floating gate 110b may be removed in a subsequent process.

After forming the control gate electrode 120a, using the control gate electrode 120a as a mask, impurity ions are implanted to form the impurity diffusion layer 122 of FIG. 1 in the active region at both sides of the control gate electrode 120a.

According to another exemplary embodiment of the present invention, an Electrically Erasable Programmable Read Only Memory (EEPROM) cell includes a floating gate having concave and convex sidewalls and a selection gate pattern crossing over the active region at one side of the floating gate.

Figure 8:
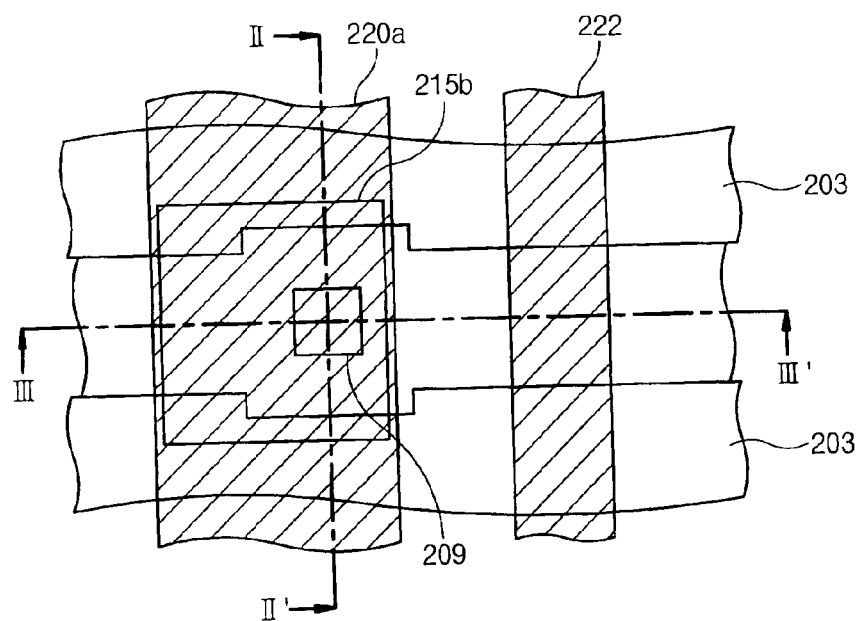
FIG. 8 is a cross-sectional view of a non-volatile memory cell in accordance with another exemplary embodiment of the present invention.
Figure 9:
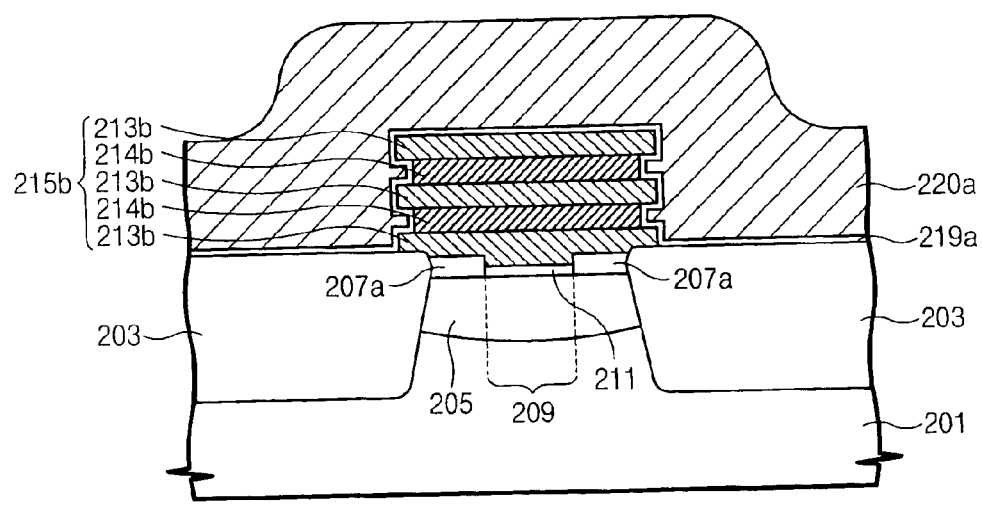
FIG. 9 is a cross-sectional view taken along a line II–II' of FIG. 8.

FIG. 8 is a cross-sectional view of a non-volatile memory cell in accordance with another exemplary embodiment of the present invention and FIG. 9 is a cross-sectional view taken along a line II–II' of FIG. 8. FIG. 10 is a cross-sectional view taken along a line III–III' of FIG. 8.

Referring to FIGS. 8, 9, and 10, a device isolation layer 203 is disposed to define an active region in a semiconductor substrate 201. The device isolation layer 203 may be formed of a trench device isolation layer.

A floating gate 215b is disposed over the active region. The floating gate 215b has concave and convex type sidewalls. The floating gate 215b comprises a plurality of first conductive patterns 213b and a plurality of second conductive patterns 214b that are alternately stacked. One of the first conductive pattern 213b and the second conductive pattern 214b protrudes to form convex portions of the sidewalls of the floating gate 215b and the other form concave portions of the sidewalls of the floating gate 215b. One of the first conductive pattern 213b and the second conductive pattern 214b may be formed of a doped polysilicon layer and the other may be formed of a doped silicon germanium layer. When the first conductive pattern 213b is formed of the doped polysilicon layer and the second conductive pattern 214b is formed of the doped silicon germanium layer, the first conductive patterns 213b protrude to form convex portions of the sidewalls of the floating gate 215b and the second conductive patterns 214b form concave portions of the sidewalls of the floating gate 215b.

A gate insulation pattern 207a is interposed between the floating gate 215b and the active region. A tunnel window region 209 may be disposed that includes a predetermined region of a bottom of the floating gate 215b and the active region thereunder. A tunnel insulation layer 211 may be interposed between the floating gate 215b and the active region of the tunnel window region 209. The tunnel insulation layer 211 may have a thickness thinner than that of the gate insulation pattern 207a. The gate insulation pattern 207a and the tunnel insulation layer 211 may be formed of silicon oxide.

Control gate electrode 220a crossing over the active region is disposed over the floating gate 215b. The control gate electrode 220a is disposed on the concave and convex sidewalls of the floating gate 215b. The control gate electrode 220a may be formed of a conductive layer, for example, a doped polysilicon layer or a polycide layer. A gate interlayer dielectric pattern 219a is interposed between the control gate electrode 220a and the floating gate 215b. The gate interlayer dielectric pattern 219a is conformally disposed along the top surface of the floating gate 215b and the concave and convex shape. The control gate electrode 220a fills the concave portion of the sidewalls of the floating gate electrode 215b. The gate interlayer dielectric pattern 219a may be formed of silicon oxide or oxide-nitride-oxide (ONO). In addition, the gate interlayer dielectric pattern 219a may be formed of high-k dielectric layer having a high dielectric constant.

A selection gate pattern 222 is disposed that crosses over the active region at one side of the control gate electrode 220a. The selection gate pattern 222 is disposed parallel to the control gate electrode 220a. The selection gate pattern 222 may comprise a selection gate insulation pattern 207b, a first selection gate electrode 215c, a selection gate interlayer dielectric pattern 219b, and a second selection gate electrode 220b that are sequentially stacked. The first selection gate electrode 215c may comprise a plurality of first selection conductive patterns 213c and a plurality of second selection conductive patterns 214c that are alternately stacked. That is, the first selection gate electrode 215c may be formed of the same material layer as the floating gate 215b. In addition, the selection gate interlayer dielectric pattern 219b may be formed of a material layer identical to that of the gate interlayer dielectric pattern 219a. The second selection gate electrode 220b may be formed of a material layer identical to that of the control gate electrode 220a. The first and second selection gate electrodes 215c and 220b may be electrically connected to each other.

A floating impurity diffusion layer 205 is disposed in the active region between the floating gate 215b and the selection gate electrode 222. A portion of the floating gate 215b may overlap a portion of the floating impurity diffusion layer 205. Therefore, the active region under the floating gate 215b is divided into a channel region "a" and an overlapping region "b" of the floating gate 215b and the floating impurity diffusion layer 205. The tunnel window region 209 may be in the overlapping region "b".

Impurity diffusion layers 223 are disposed in the active region that is at one side of the floating gate 215b and opposite to one side of the floating impurity diffusion layer 205, and in the active region that is at the one side of the selection gate pattern 222 and opposite to the other side of the floating impurity diffusion layer 205, respectively. The impurity diffusion layers 223 may be source/drain regions of the EEPROM cell.

In the EEPROM cell, electrons in the floating impurity diffusion layer 205 flow into the floating gate 215b through the tunnel window region 209, or electrons in the floating gate 215b are ejected to the floating impurity diffusion layer 205. The electrons may tunnel the tunnel insulation layer 211 by FN tunneling. Alternatively, the tunnel window region 209 may be omitted. In this case, electrons may tunnel the gate insulation pattern 207a throughout the overlapping region "b".

In the EEPROM cell, the floating gate 215b has increased surface area due to the concave and convex shaped sidewalls. Thus, a capacitance between the floating gate 215b and the control gate electrodes 220a increases. As a result, coupling ratio increases to reduce the operation voltage of the EEPROM.

FIGS. 11A through 15A are top plane views showing a non-volatile memory cell in accordance with another exemplary embodiment of the present invention. FIGS. 11B through 15B are cross-sectional views taken along a line IV–IV' of FIGS. 11A through 15A. FIGS. 11C through 15C are cross-sectional views taken along a line V–V' of FIGS. 11A through 15A.

Figure 11A:
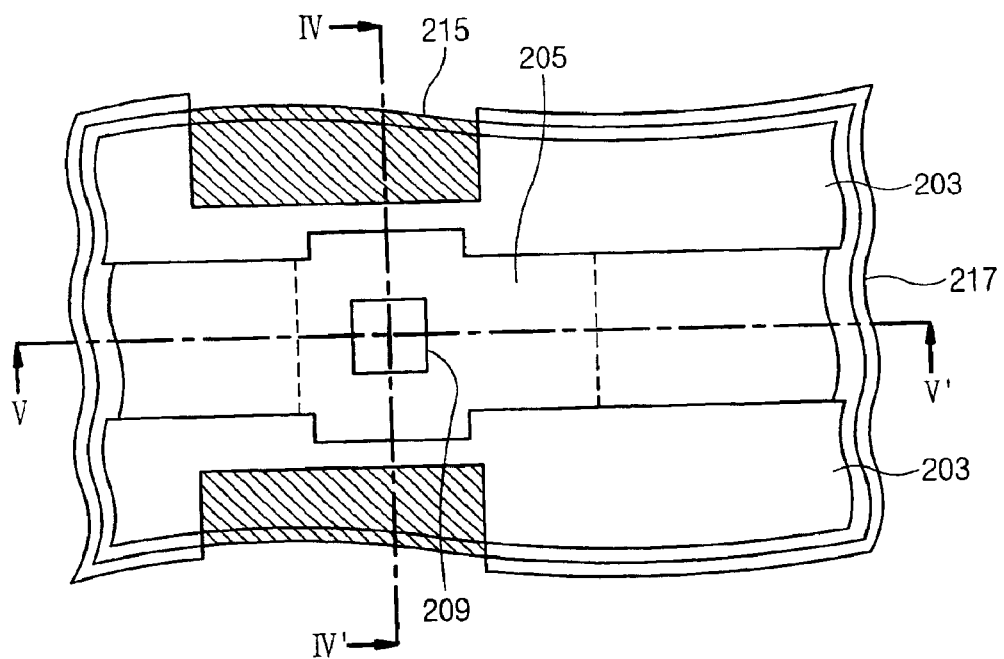
Figure 11B:
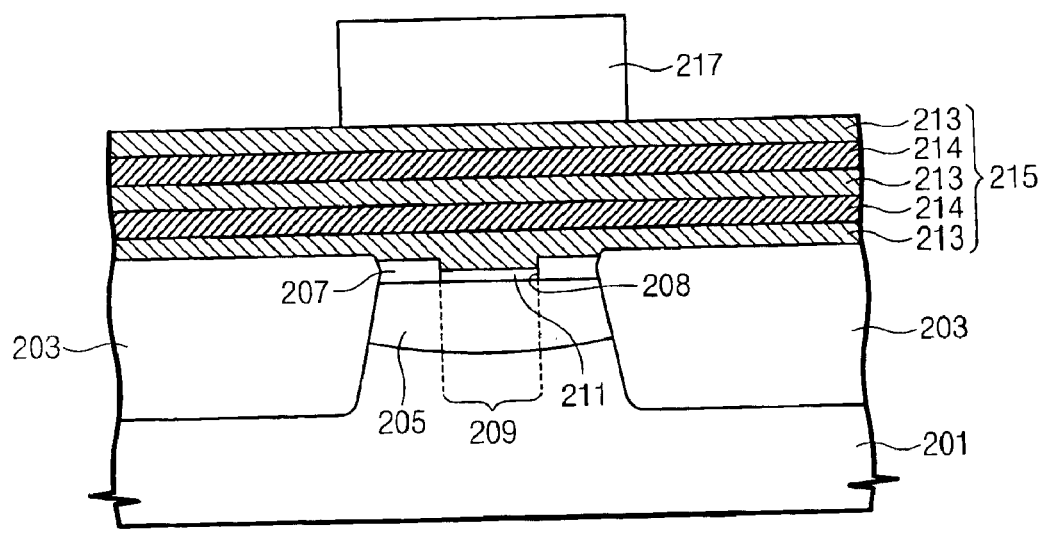
Figure 11C:
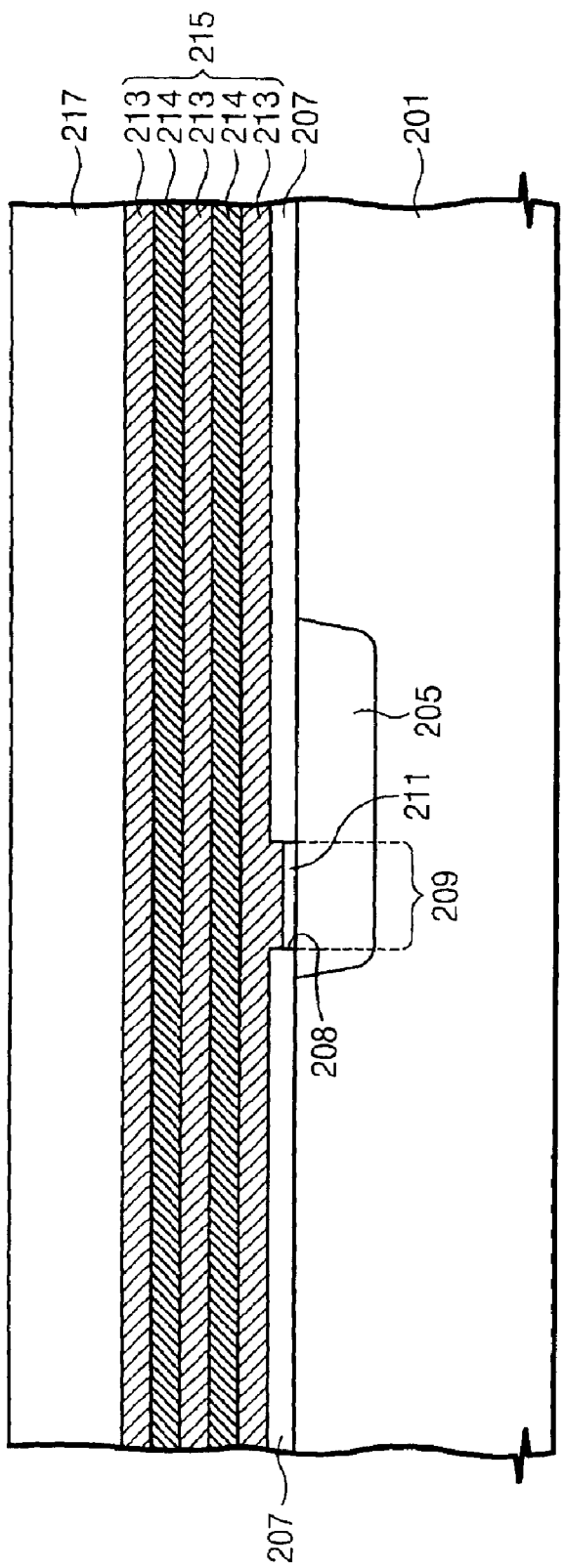

Referring to FIGS. 11A, 11B and 11C, a device isolation layer 203 is formed to define an active region. The device isolation layer 203 may be formed of a trench device isolation layer.

Impurity ions are selectively implanted into a predetermined region of the active region to form a floating impurity diffusion layer 205. A gate insulation layer 207 is formed on the active region with the floating impurity diffusion layer 205. The gate insulation layer 207 may be formed of thermal oxide or CVD silicon oxide. The gate insulation layer 207 is patterned to form an opening 208 that exposes a predetermined region of the floating impurity diffusion layer 205. The region with the opening 208 corresponds to a tunnel window region 209. A tunnel insulation layer 211 is formed on the exposed floating impurity diffusion layer 205. The tunnel insulation layer 211 may be formed thinner than that of the gate insulation layer 207. The tunnel insulation layer 211 may be formed of thermal oxide or CVD silicon oxide.

The steps of forming the opening 208 and the tunnel insulation layer 211 that are disposed in the tunnel window region 209 may be omitted.

A gate conductive layer 215 is formed on an entire surface of the semiconductor substrate 201 with the tunnel insulation layer 211. The gate conductive layer 215 may comprise a plurality of first conductive layers 213 and a plurality of second conductive layers 214 that are alternately stacked. One of the first and second conductive layers 213 and 214 may be formed of doped polysilicon layer and the other is preferably formed of doped silicon germanium layer. The doped polysilicon layer and the doped silicon germanium layer may be doped using an in-situ method. Alternatively, the doped polysilicon layer and the silicon germanium layer may be doped by implanting impurity ions.

A photoresist pattern 217 is formed on the gate conductive layer 215.

Referring to FIGS. 12A, 12B, 12C, 13A, 13B and 13C, the gate conductive layer 215 is anisotropically patterned using the photoresist pattern 217 as a mask, thereby forming a preliminary gate conductive pattern 215a. The preliminary gate conductive pattern 215a exposes sidewalls that are disposed on the device isolation layer 203 from sidewalls of a subsequent floating gate. That is, the patterning process separates the floating gate, which will be formed in a subsequent process, from neighboring floating gates (not shown) with the device isolation layer 203 as a boundary. The exposed sidewall of the preliminary gate conductive pattern 215a comprises first and second conductive layers 213a and 214a that are etched using the anisotropic etching.

Figure 12A:
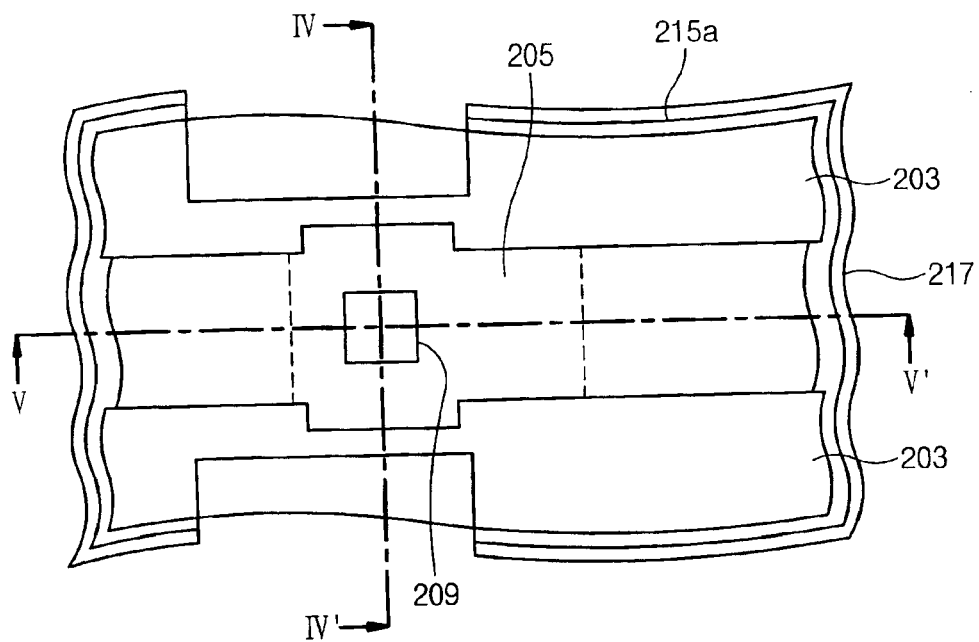
Figure 12B:
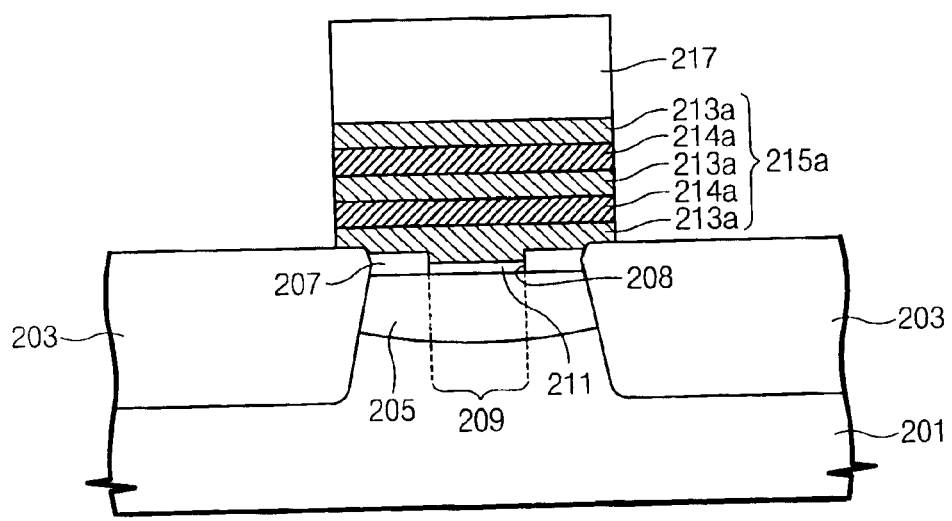
Figure 12C:
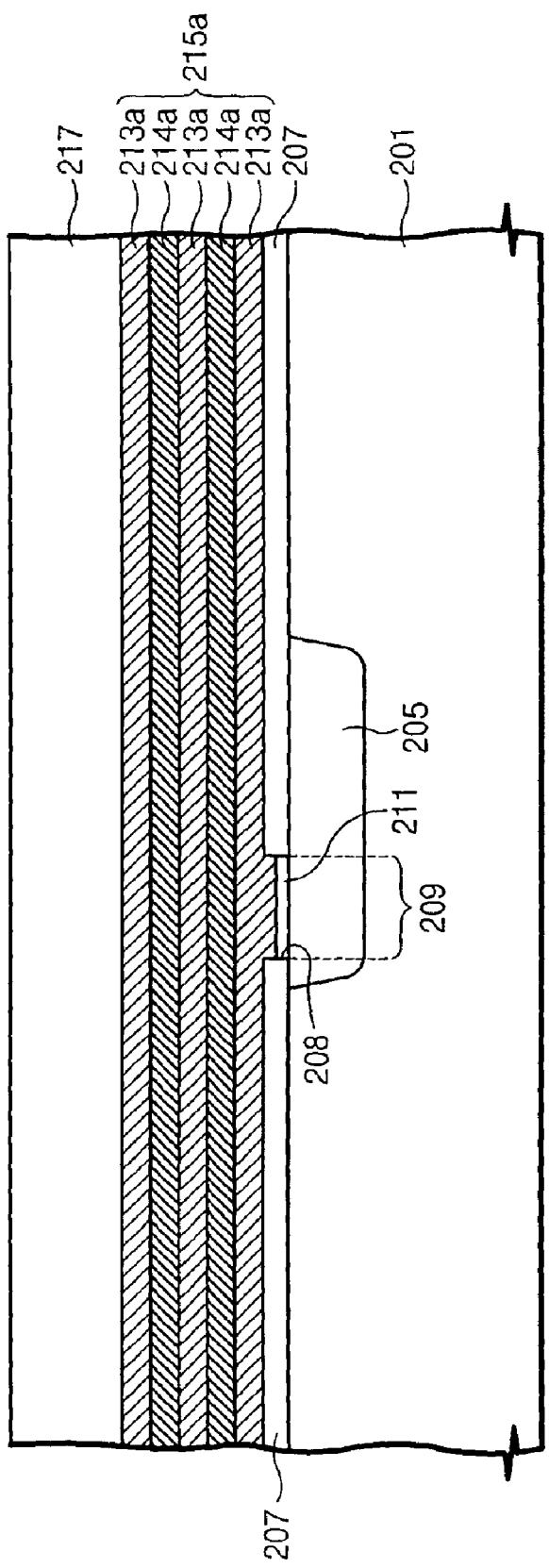
Figure 13A:
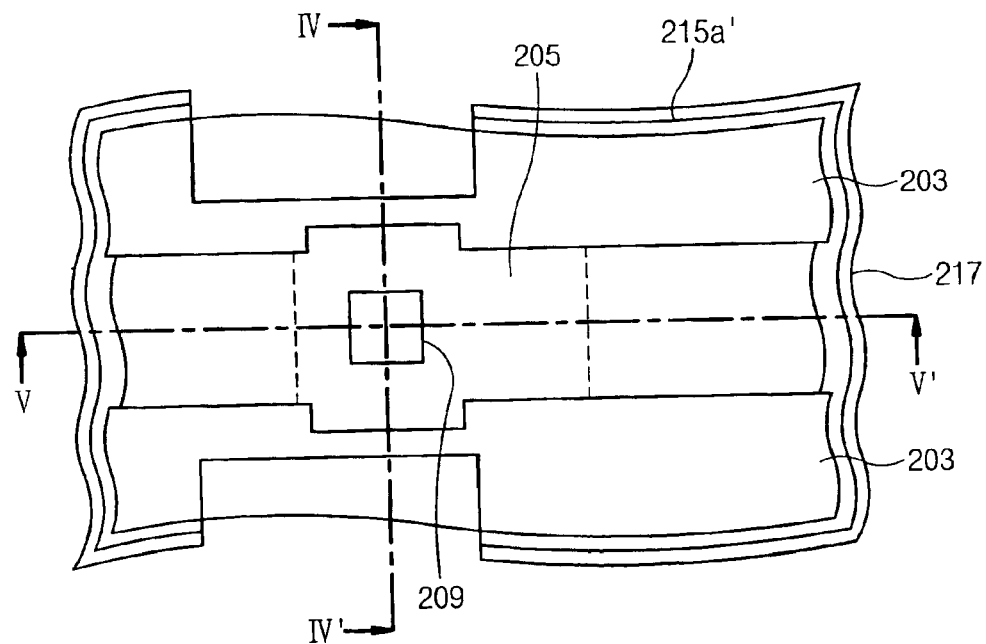
Figure 13B:
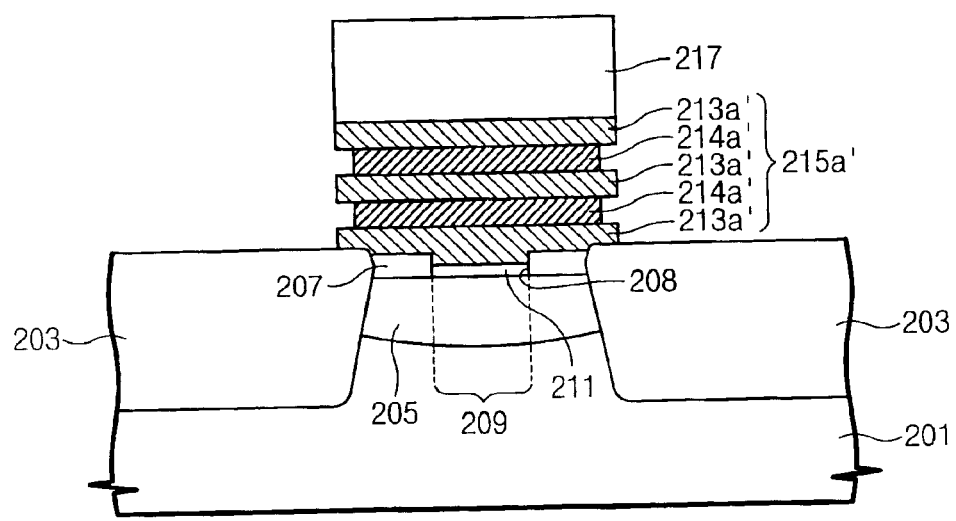
Figure 13C:
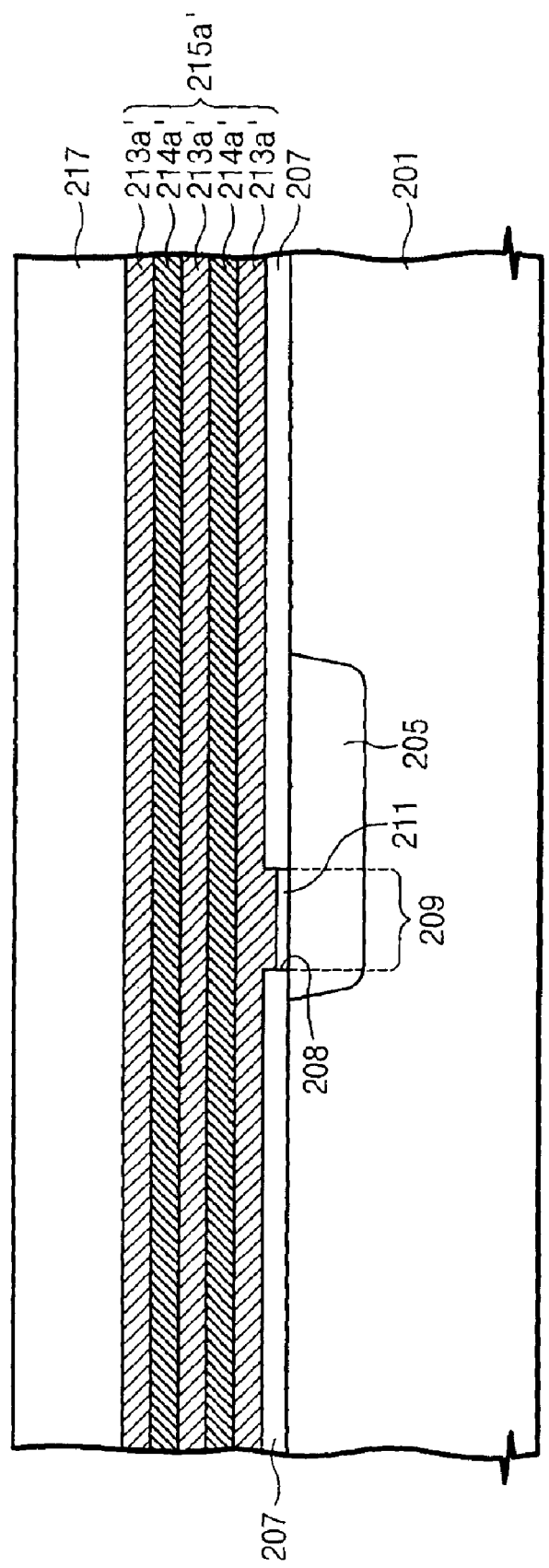
Figure 14A:
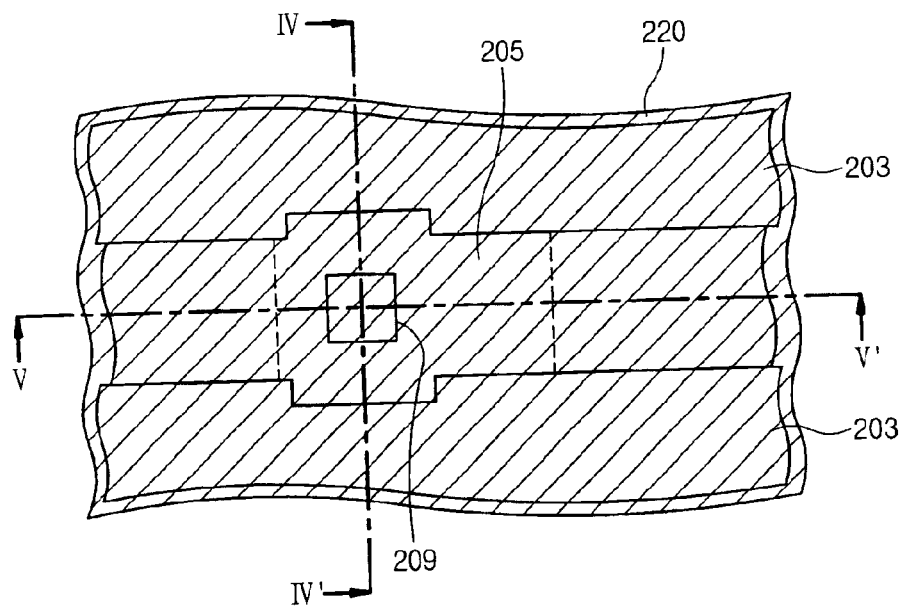
Figure 14B:
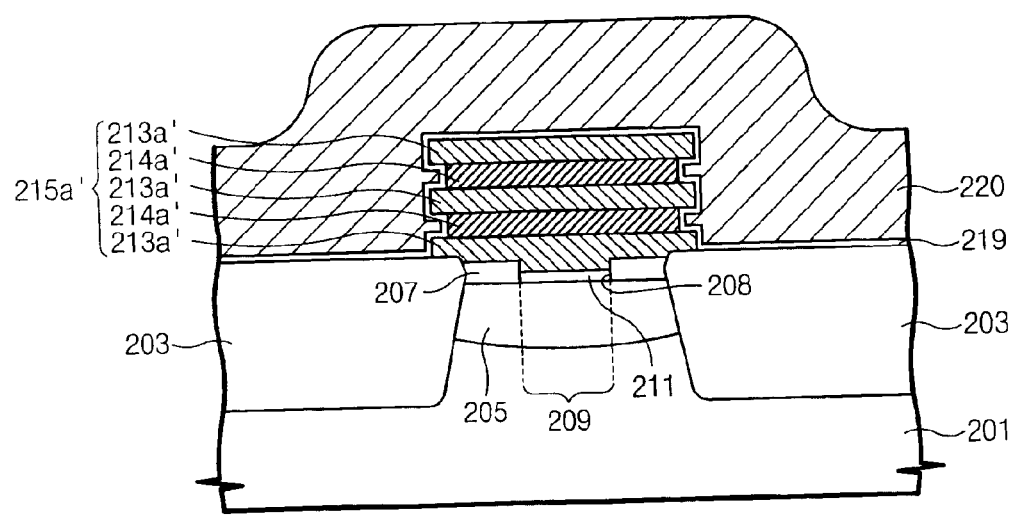
Figure 14C:
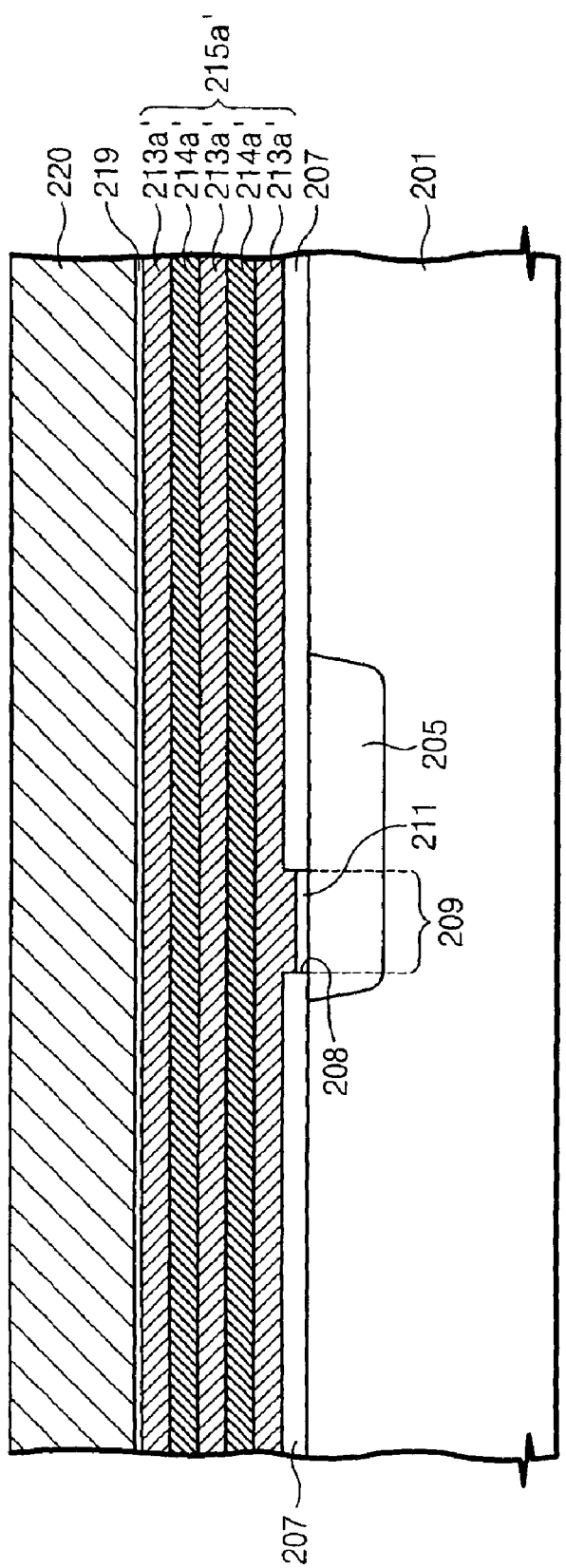
Figure 15A:
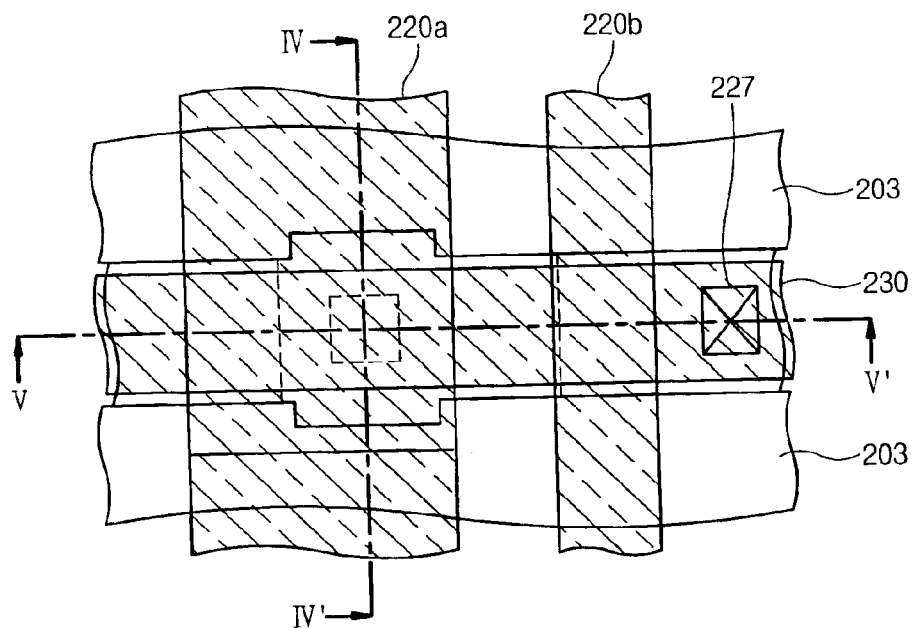
Figure 15B:
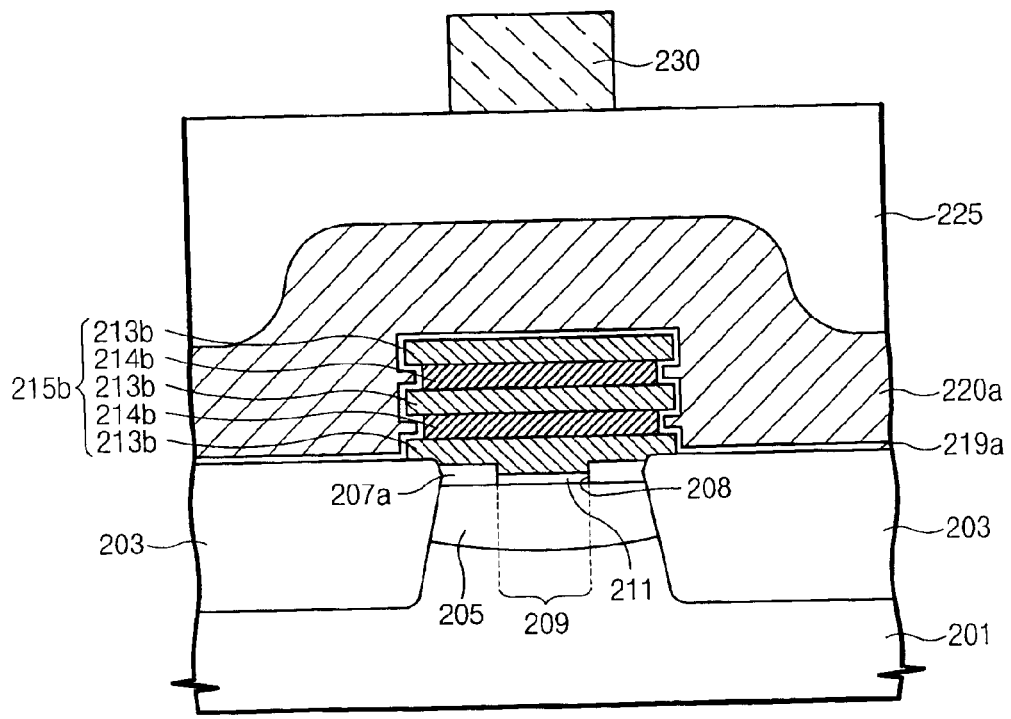

Using the photoresist pattern 217 as a mask, the preliminary gate conductive pattern 215a is isotropically etched to form a gate conductive pattern 215a' with the concave and convex shaped sidewalls. The isotropic etching has etch selectivity with respect to the first and second conductive layers 213a and 214a that are isotropically etched. The isotropic etching may be performed in the manner of dry etching that uses etch gas including $HeO_2$. The etch gas including $HeO_2$ has etch selectively with respect to the doped poly silicon layer and the doped silicon germanium layer. Specifically, the etch gas including $HeO_2$ gas etches the doped silicon germanium layer faster than the doped polysilicon layer. Thus, if the first and second conductive layers 213 and 214 of FIG. 12B are formed of the doped polysilicon layer and the doped silicon germanium layer, respectively, the isotropically etched second conductive layers 214a' is etched more than the isotropically etched first conductive layers 213a', such that concave portions of the sidewalls of the gate conductive pattern 215a' are formed. The isotropically etched first conductive layers 213a' protrude to form convex portions of the gate conductive pattern 215a'.

Referring to FIGS. 14A, 14B, 14C, 15A, 15B, and 15C, the photoresist pattern 217 is removed to expose a top surface of the gate conductive pattern 215a'. A conformal gate interlayer dielectric layer 219 is formed on an entire surface of a substrate 201 with the exposed gate conductive pattern 215a'. A control gate conductive layer 220 is formed on the gate interlayer dielectric layer 219. The gate interlayer dielectric layer 219 is conformally formed along concave and convex shape of the sidewalls of the gate conductive pattern 215a'. The control gate conductive layer 220 fills convex portions of the sidewalls of the gate conductive pattern 215a'. The gate interlayer dielectric layer 219 may be formed of a silicon oxide layer or an ONO layer (i.e., a dielectric layer). Alternatively, the interlayer dielectric layer 219 may be formed of a high-k dielectric layer having dielectric constant higher than the ONO layer. The control gate conductive layer 220 may be formed of a doped polysilicon layer or a polycide layer.

The control gate conductive layer 220, the gate interlayer dielectric layer 219, the gate conductive pattern 215a' and the gate insulation layer 207 are successively patterned to form a gate insulation pattern 207a, a floating gate 215b, a gate interlayer dielectric pattern 219a and a control gate electrode 220a. At the same time, a selection gate pattern 222 is formed that crosses over the active region at one side of the floating gate 215b. The control gate electrode 220a crosses over the active region parallel to the selection gate pattern 222. The first conductive patterns 213b and the second conductive patterns 214b are alternately stacked to form the floating gate 215b. The floating gate 215b has concave and convex shaped sidewalls. Thus, the floating gate 215b has an increased surface area. The control gate electrode 220a is also formed on the top surface and the concave and convex shaped sidewalls of the floating gate 215b. As a result, capacitance between the floating gate 215b and the control gate electrode 220a increases to raise coupling ratio. Therefore, an operation voltage of the EEPROM cell may be reduced.

The selection gate pattern 222 comprises a selection gate insulation pattern 207b, a first selection gate electrode 215c, a selection gate interlayer dielectric layer 219b and a second selection gate electrode 220b that are sequentially stacked. The first selection gate electrode 215c comprises selection first conductive patterns 213c and selection second conductive patterns 214c that are alternately stacked. That is, the first section gate electrode 215c may be formed of a material layer identical to the floating gate 215b. The selection gate interlayer dielectric pattern 219b and the second selection gate electrode 220b may be formed of a material layer identical to the gate interlayer dielectric pattern 219a and the control gate electrode 220a, respectively.

A floating impurity diffusion layer 205 is disposed in an active region between the floating gate 215b and the selection gate pattern 222. A portion of a bottom of the floating gate 215b is formed on the tunnel insulation layer 211. Therefore, a portion of the floating gate 215b overlaps a portion of the floating impurity diffusion layer 205.

Impurity ions are implanted into the active region that is beside the floating gate 215b and opposite to one side of the floating diffusion layer 205 and into the active region that is beside the selection gate pattern 222 and opposite to the other side of the floating diffusion layer 205. The impurity diffusion layers 223 may correspond to source/drain regions of the EEPROM cell.

An interlayer insulation layer 225 is formed on an entire surface of the semiconductor substrate 201 with the impurity diffusion layer 223. A bit line contact plug 227 is formed through the interlayer insulation layer 225. The bit line contact plug 227 is electrically connected to the impurity diffusion layer 223 neighboring the selection gate electrode 222. A bit line 230 is formed on the interlayer insulation layer 225 and the bit line 230 is electrically connected to the bit line contact plug 227. The bit line 230 crosses over the control gate electrode 220a and the selection gate electrode 222.

According to the various exemplary embodiments of the present invention, a non-volatile memory cell including a floating gate having sidewalls are formed to have a concave and convex shape. Thus, surface area of the floating gate is increased and capacitance between the floating gate and the control gate electrode is increased, such that a coupling ratio rises. As a result, the operation voltage of the non-volatile memory cell can be reduced.

What is claimed is:

1. A non-volatile memory cell comprising:
   a device isolation layer disposed in a substrate to define an active region;
   a floating gate disposed over the active region and comprised of a plurality of first conductive patterns and a plurality of second conductive patterns which are alternately stacked; and
   a first insulation layer interposed between the floating gate and the active region, wherein one of the first and second conductive patterns protrudes to form concave and convex shaped sidewalls of the floating gate.

2. The non-volatile memory cell of claim 1, wherein one of the first and second conductive patterns is formed of doped polysilicon layers and the other of the first and second conductive patterns is formed of doped silicon germanium layers.

3. The nonvolatile memory cell of claim 2, wherein the doped polysilicon layers protrude to form convex portions of the sidewalls of the floating gate and the doped silicon germanium layers forms concave portion of the sidewalls of the floating gate.

4. The non-volatile memory cell of claim 1, further comprising:
- a control gate electrode disposed over the floating gate and crossing over the active region; and
- a gate interlayer dielectric pattern disposed between the control gate electrode and the floating gate,
- wherein the gate interlayer dielectric pattern and the control gate electrode are disposed over a top surface and the concave and convex sidewalls of the floating gate.

5. The non-volatile memory cell of claim 4, further comprising impurity diffusion layers formed in the active region at sides of the control gate electrode.

6. The non-volatile memory cell of claim 4, further comprising:
- a selection gate pattern crossing over the active region at one side of the control gate electrode;
- a floating impurity diffusion layer disposed in the active region between the selection gate pattern and the control gate electrode; and
- an impurity diffusion layer respectively formed in the active region that is beside the selection gate pattern and opposite to one side of the floating impurity diffusion layer, and in the active region that is beside the floating gate and opposite another side of the floating impurity diffusion layer,
- wherein a portion of the floating impurity diffusion layer overlaps a portion of the floating gate.

7. The non-volatile memory cell of claim 6, further comprising:
- a tunnel window region including a predetermined bottom region of the floating gate and the active region thereunder; and
- a second insulation layer disposed between the floating gate and the active region in the tunnel window region,
- wherein the tunnel window region is disposed in the overlapping region of the floating gate and the floating impurity diffusion layer, and the second insulation layer is thinner than the first insulation layer.

8. The non-volatile memory cell of claim 6, wherein the selection gate pattern comprises a first selection gate electrode, a selection gate dielectric pattern and a second selection gate electrode,
- wherein the first selection gate electrode is formed of the same material layer as the floating gate, the selection gate dielectric pattern is formed of the same material layer as the gate interlayer dielectric pattern, and the second selection gate electrode is formed of the same material layer as the control gate electrode.

9. A non-volatile memory cell comprising:
- substrate;
- an active region formed in the substrate; and
- a floating gate having sidewalls formed over the active region, the sidewalls having protruding portions, wherein the floating gate comprises a plurality of first conductive patterns and a plurality of second conductive patterns, and wherein one of the plurality of first conductive patterns and the plurality of second conductive.

10. The non-volatile memory of claim 9, wherein one of the plurality of first conductive patterns and the plurality of second conductive patterns is formed of doped polysilicon layers and the other of the plurality of first conductive patterns and the plurality of second conductive patterns is formed of doped silicon germanium layers.

11. The non-volatile memory of claim 10, wherein the doped polysilicon layers form the protruding portions of the sidewalls.

* * * * *